(12) United States Patent
Javorka et al.

(10) Patent No.: US 9,093,526 B2
(45) Date of Patent: Jul. 28, 2015

(54) METHODS OF FORMING A SIDEWALL SPACER HAVING A GENERALLY TRIANGULAR SHAPE AND A SEMICONDUCTOR DEVICE HAVING SUCH A SPACER

(71) Applicant: GLOBALFOUNDRIES Inc., Grand Cayman (KY)

(72) Inventors: Peter Javorka, Radeburg (DE); Juergen Faul, Radebeul (DE); Bastian Haussdoerfer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 149 days.

(21) Appl. No.: 13/713,085

(22) Filed: Dec. 13, 2012

(65) Prior Publication Data

US 2014/0167119 A1    Jun. 19, 2014

(51) Int. Cl.
*H01L 21/311*  (2006.01)
*H01L 29/78*  (2006.01)
*H01L 21/314*  (2006.01)
*H01L 29/66*  (2006.01)

(52) U.S. Cl.
CPC .......... *H01L 29/7833* (2013.01); *H01L 21/314* (2013.01); *H01L 21/31116* (2013.01); *H01L 29/66598* (2013.01); *H01L 29/78* (2013.01)

(58) Field of Classification Search
CPC .............................. H01L 21/314; H01L 29/78
USPC .................................................. 438/694, 697
See application file for complete search history.

(56) References Cited

U.S. PATENT DOCUMENTS

| 6,010,930 | A  | * | 1/2000  | Keller et al. | 438/238 |
| 7,544,556 | B1 | * | 6/2009  | Mui et al.   | 438/199 |
| 2008/0057725 | A1 | * | 3/2008  | Hwang      | 438/710 |
| 2008/0308899 | A1 | * | 12/2008 | Huang et al. | 257/528 |

OTHER PUBLICATIONS

Augendre et al., "Thin L-shaped spacers for CMOS devices," IMEC.
Bazizi et al., "Analysis of USJ formation with combined RTA/Laser annealing conditions for 28nm High-K/Metal Gate CMOS technology using advanced TCAD for process and device simulation," Globalfoundries.

* cited by examiner

*Primary Examiner* — Long K Tran
(74) *Attorney, Agent, or Firm* — Amerson Law Firm, PLLC (57) ABSTRACT

A method of forming a spacer is disclosed that involves forming a layer of spacer material above an etch stop layer, performing a first main etching process on the layer of spacer material to remove some of material, stopping the etching process prior to exposing the etch stop layer and performing a second over-etch process on the layer of spacer material, using the following parameters: an inert gas flow rate of about 50-200 sscm, a reactive gas flow rate of about 3-20 sscm, a passivating gas flow rate of about 3-20 sscm, a processing pressure about 5-15 mT, a power level of about 200-500 W for ion generation and a bias voltage of about 300-500 V. A device includes a gate structure positioned above a semiconducting substrate, a substantially triangular-shaped sidewall spacer positioned proximate the gate structure and an etch stop layer positioned between the spacer and the gate structure.

10 Claims, 8 Drawing Sheets

METHODS OF FORMING A SIDEWALL SPACER HAVING A GENERALLY TRIANGULAR SHAPE AND A SEMICONDUCTOR DEVICE HAVING SUCH A SPACER

BACKGROUND OF THE INVENTION

1. Field of the Invention

Generally, the present disclosure relates to the manufacture of sophisticated semiconductor devices, and, more specifically, to various methods of forming a sidewall spacer having a generally triangular shape and to various semiconductor devices having such a sidewall spacer.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (FETs) represent one important type of circuit element that substantially determines performance of the integrated circuits. Field effect transistors are typically either NFET devices or PFET devices. During the fabrication of complex integrated circuits using, for instance, MOS technology, millions of transistors, e.g., NFET transistors and/or PFET transistors, are formed on a substrate including a crystalline semiconductor layer. A field effect transistor, whether an NFET or a PFET device, is a planar device that typically includes a source region, a drain region, a channel region that is positioned between the source region and the drain region, a gate insulation layer and a gate electrode positioned above the gate insulation layer over the channel region. By applying an appropriate voltage to the gate electrode, the channel region becomes conductive and current is allowed to flow from the source region to the drain region. The channel length of a MOS transistor is generally considered to be the lateral distance between the source/drain regions.

Ion implantation is a technique that is employed in many technical fields to implant dopant ions into a substrate so as to alter the characteristics of the substrate or of a specified portion thereof. The rapid development of advanced devices in the semiconductor industry is based on, among other things, the ability to generate highly complex dopant profiles within tiny regions of a semiconducting substrate by performing advanced implantation techniques through a masking layer. In the case of an illustrative transistor, ion implantation may be used to form various doped regions, such as halo implant regions, extension implant regions and deep source/drain implant regions, etc.

Figure 1A:
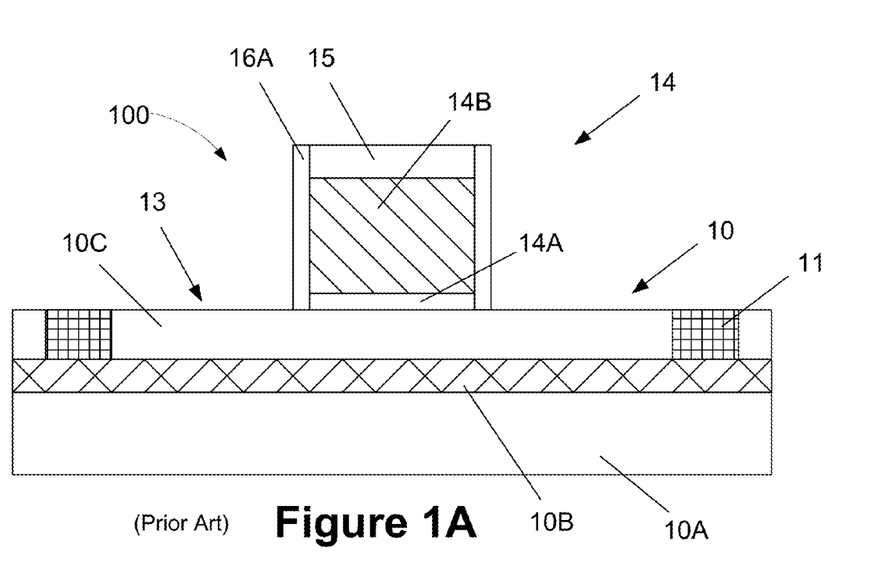
FIGS. 1A-1G depict one illustrative process flow for forming sidewall spacers and source/drain regions on a prior art transistor device and an image of one illustrative embodiment of a prior art sidewall spacer taken with a scanning electron microscope (SEM)

An illustrative ion implantation sequence for forming source/drain regions for an illustrative prior art transistor 100 will now be discussed with reference to FIGS. 1A-1G. FIG. 1A depicts the transistor 100 at an early stage of fabrication, wherein a gate structure 14 has been formed above a silicon-on-insulator (SOI) substrate 10 that is comprised of a bulk substrate 10A, a buried insulation layer 10B (a so-called BOX layer) and an active layer 10C where semiconductor devices will be formed. An active region 13 is defined in the active layer 10C by a shallow trench isolation structure 11. The gate structure 14 typically includes a gate insulation layer 14A and a conductive gate electrode 14B. A gate cap layer 15, e.g., a layer of silicon nitride, is typically formed above the gate electrode 14B. The gate structure 14 and the gate cap layer 15 may be formed by forming layers of material that correspond to the gate insulation layer 14A, the gate electrode 14B and the gate cap layer 15 and thereafter patterning those layers of material using known etching and photolithography techniques. A first sidewall spacer 16A is formed adjacent the gate structure 14. The first sidewall spacer 16A is typically formed by conformably depositing a layer of spacer material and thereafter performing an anisotropic etching process. The first sidewall spacer 16A is sometimes referred to in the industry as "spacer zero," and it may have a base thickness that falls within the range of about 8-15 nm, depending upon the particular application.

Figure 1B:
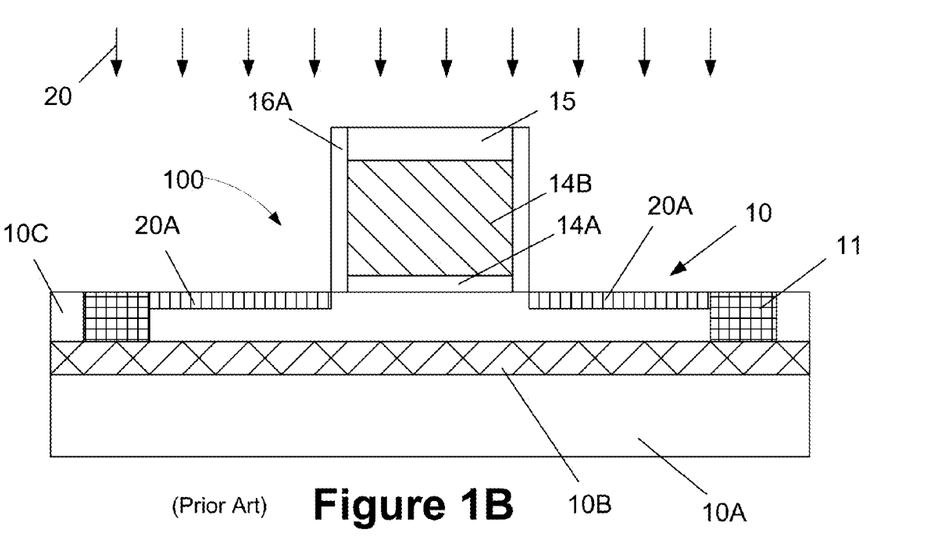
Figure 1C:
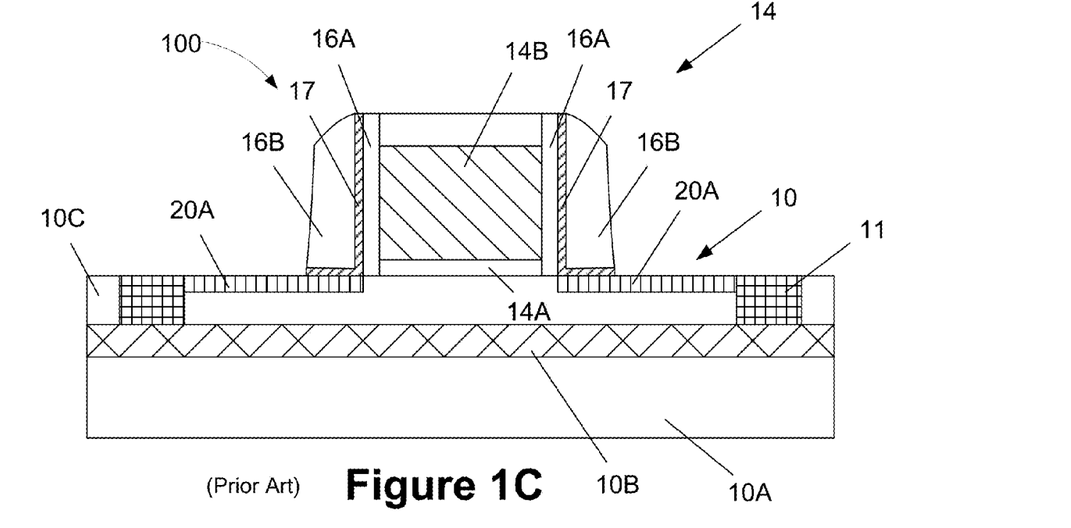
Figure 1D:
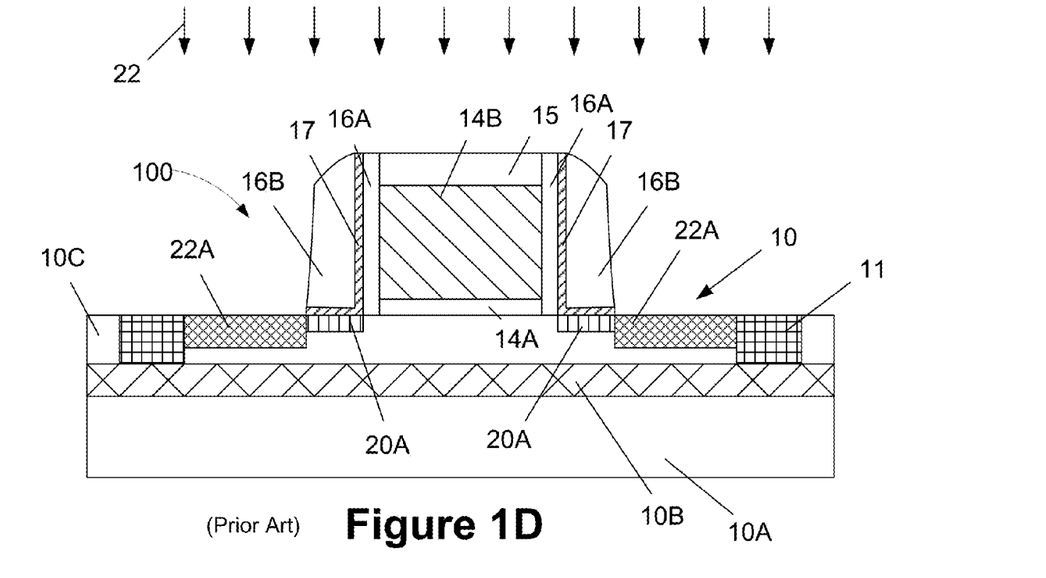

The masking layers that would be used during the implantation sequence shown in FIGS. 1A-1G are not depicted in the drawings. As shown in FIG. 1B, an initial ion implantation process 20 is typically performed to form so-called extension implant regions 20A in the substrate 10. Typically, the extension implant regions 20A will be self-aligned with respect to the first sidewall spacers 16A. In some applications, the first sidewall spacer 16A may be omitted. In such a case, the extension implant region 20A would be self-aligned relative to the sidewall of the gate structure 14. Then, as shown in FIG. 1C, a liner layer 17, e.g., silicon dioxide, and a second sidewall spacer 16B are formed proximate the gate structure 14. The liner layer 17 and the second sidewall spacer 16B are typically formed by conformably depositing a layer of the appropriate material. In the case of the spacer 16B, the spacer 16B is formed by performing an anisotropic etching process on the deposited layer of spacer material. Then, as shown in FIG. 1D, a second ion implantation process 22 is performed on the transistor 100 to form so-called deep source/drain implant regions 22A in the substrate 10. The ion implantation process 22 performed to form the deep source/drain implant regions 22A is typically performed using a higher dopant dose and a higher implant energy than the ion implantation process 20 that is performed to form the extension implant regions 20A.

Figure 1E:
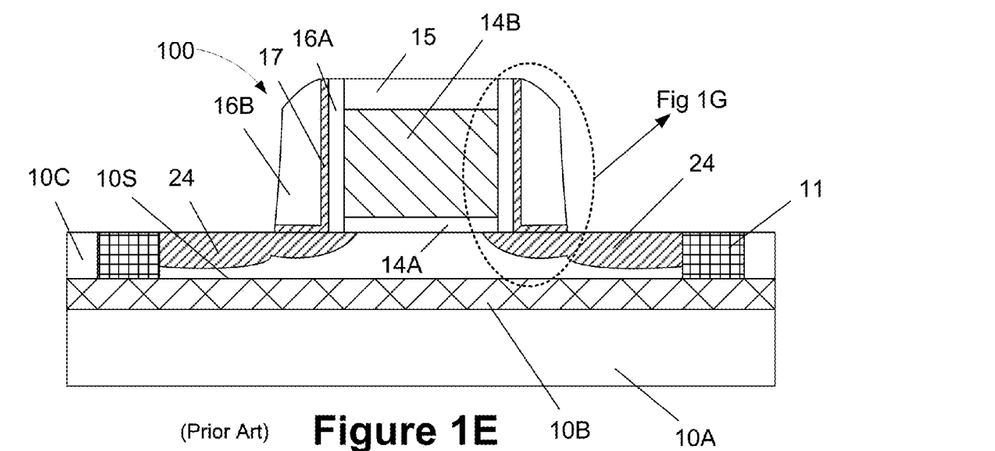

Thereafter, as shown in FIG. 1E, a heating or anneal process is performed to form the final source/drain regions 24 for the transistor 100. This heating process repairs the damage to the lattice structure of the substrate material as a result of the implantation processes and it activates the implanted dopant materials, i.e., the implanted dopant materials are incorporated into the silicon lattice. During the anneal process, the implanted dopants migrate and the dope regions 20A, 22A (FIG. 1D) tend to merge together to a certain degree. Of course, the type of dopants implanted, either N-type or P-type dopants, depends upon the type of transistor being made, i.e., an NFET transistor or a PFET transistor, respectively. Such implantation processes are performed using well-known ion implantation systems.

Figure 1F:
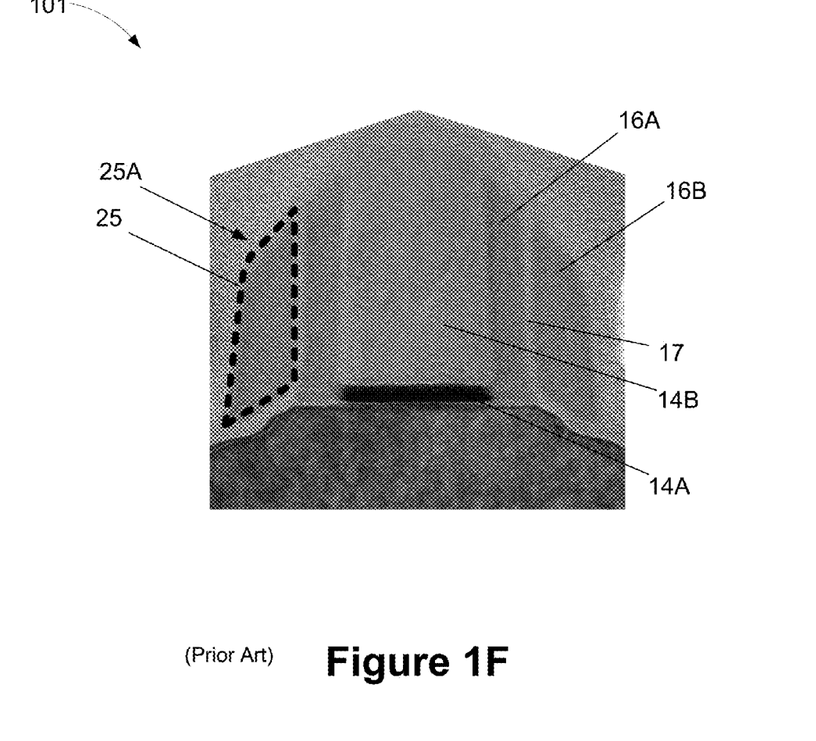

FIG. 1F is an image of a transistor device taken with a scanning electron microscope. The various structures in the transistor that correspond to the gate insulation layer 14A, the gate electrode 14B, the first sidewall spacer 16A, the liner layer 17 and the second sidewall spacer 16B are identified by the same reference number. As depicted by the dashed line 25, the second sidewall spacer 16B has a cross-sectional configuration that has a general quadrilateral configuration with an upper surface and corner regions 25A that tends to be rounded to a certain degree.

Figure 1G:
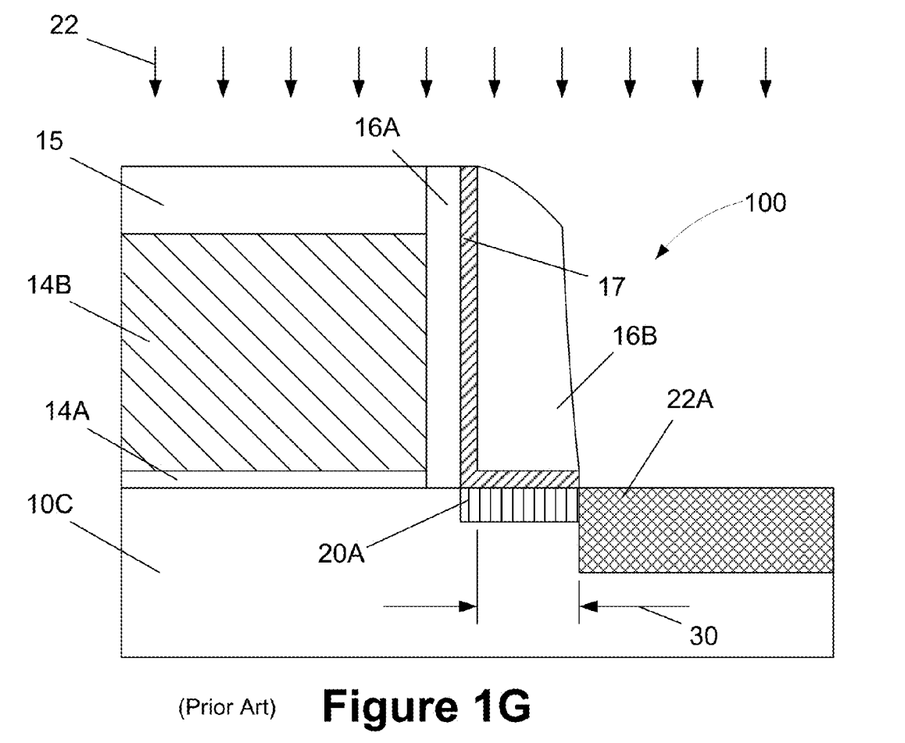

FIG. 1G is an enlarged view of a portion of the device 100, taken where indicated in FIG. 1E. Fundamentally, during the source/drain implant process 22, the second sidewall spacer 16B acts as an implant mask with respect to the region 30 of the substrate that is under the spacer 16B. As a result, there tends to be less dopant material in the region 30, which means there is a higher resistance in this portion of the final source/drain region of the device 100 than is otherwise desirable. Such increased resistance leads to problems such as, for example, slower device operation, increased heating of the device, etc. Prior art efforts to reduce the impact of implanting through a sidewall spacer, such as the spacer 16B depicted in FIG. 1G, have involved forming one or more "L-shaped" spacers with the intent of producing an appropriately "graded" source/drain profile by partially implanting ions through the lateral "leg" of the L-shaped spacer. One drawback to this approach is that there is a limit on the amount of energy that can be used in the implant process through the L-shaped spacer. Moreover, due to the configuration of the L-shaped spacers, the implanted dopant materials tended to have a stepped-type configuration, and not the relatively smooth dopant gradient profile that is desirable for modern transistor devices.

The present disclosure is directed various methods of forming a sidewall spacer having a generally triangular shape for various semiconductor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a sidewall spacer having a generally triangular shape and to various semiconductor devices having such a sidewall spacer. One illustrative method disclosed herein involves forming a layer of spacer material above an etch stop layer, performing a first main etching process on the layer of spacer material to remove some of the layer of spacer material, stopping the first main etching process prior to exposing the etch stop layer and, after stopping the first main etching process, performing a second over-etch process on the layer of spacer material, wherein the first and second etching processes are performed using the following parameters: an inert gas flow rate within the range of about 50-200 sscm, a reactive gas flow rate within the range of about 3-20 sscm, a passivating gas flow rate within the range of about 3-20 sscm, a processing pressure within about 5-15 mT, a power level of about 200-500 W for ion generation and a bias voltage of about 300-500 V.

One illustrative device disclosed herein includes a gate structure positioned above a semiconducting substrate, a sidewall spacer positioned proximate the gate structure, wherein the spacer has a substantially triangular cross-sectional configuration, and an etch stop layer positioned between the spacer and the gate structure.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a sidewall spacer having a generally triangular shape on various semiconductor devices and to the resulting devices with such a spacer. As will be readily apparent to those skilled in the art upon a complete reading of the present application, the methods and devices disclosed herein may be implemented using a variety of different devices and technologies, e.g., NFET, PFET, CMOS, etc., and they may be employed in manufacturing a variety of different integrated circuit products, including, but not limited to, ASIC's, logic devices, memory devices, etc. With reference to the attached drawings, various illustrative embodiments of the methods and devices disclosed herein will now be described in more detail.

Figure 2A:
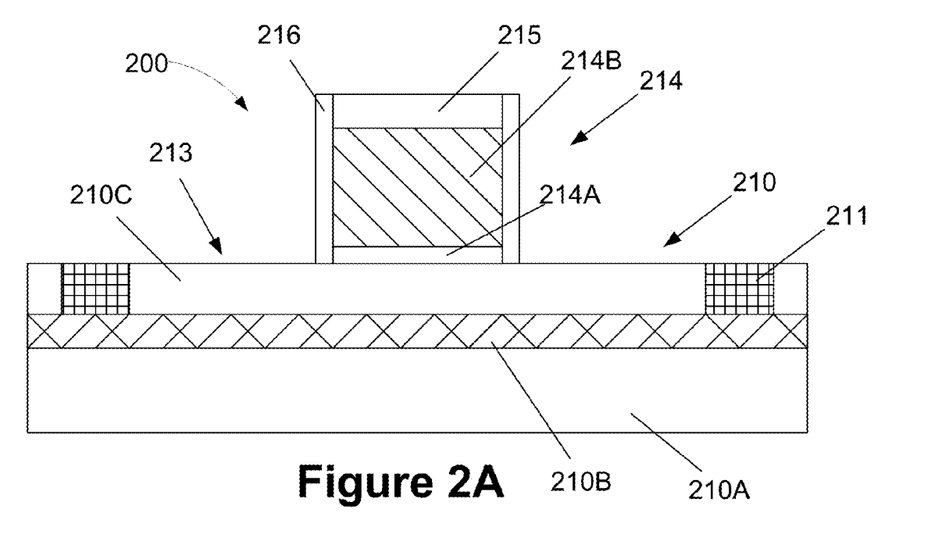
FIGS. 2A-2I depict various methods disclosed herein of forming a sidewall spacer having a generally triangular shape on a transistor device and an SEM image of one illustrative embodiment of a semiconductor device having a sidewall spacer as disclosed herein that has a generally triangular shaped configuration.

FIG. 2A depicts an illustrative transistor 200 at an early stage of fabrication, wherein a gate structure 214 has been formed above a silicon-on-insulator (SOI) substrate 210 that is comprised of a bulk substrate 210A, a buried insulation layer 210B (a so-called BOX layer) and an active layer 210C where semiconductor devices will be formed. An active region 213 is defined in the active layer 210C by a shallow trench isolation structure 211. The substrate 210 may also have a bulk configuration and it may be made of materials other than silicon. Thus, the terms "substrate" or "semiconducting substrate" should be understood to cover all semiconducting materials and all forms of such materials. Also depicted in FIG. 2A is an illustrative gate cap layer 215 and a first sidewall spacer 216 formed on the sidewalls of the gate electrode 214B.

The gate structure 214 typically includes a gate insulation layer 214A and a conductive gate electrode 214B. The gate structure 214 and gate cap layer 215 may be formed by forming layers of material that correspond to the gate insulation layer 214A, the gate electrode 214B and the gate cap layer 215 and thereafter patterning those layers of material using known etching and photolithography techniques. For example, various layers of material that correspond to the gate insulation layer 214A, the gate electrode 214B and the gate cap layer 215 may be formed above the substrate 210 by performing one or more deposition and/or thermal growth processes. Thereafter, a patterned masking layer (not shown), such as a photoresist mask, is formed above the various layers of material, and one or more etching processes are performed through the patterned masking layer to define the gate insulation layer 214A, the gate electrode 214B and the gate cap layer 215. As will be appreciated by one skilled in the art after a complete reading of the present application, the gate structure 214 may be formed using a variety of different materials and by performing a variety of known techniques. For example, the gate insulation layer 214A may be comprised of a variety of different insulating materials, e.g., silicon dioxide, a so-called high-k insulating material (k value greater than 10). The gate electrode 214B may be comprised of polysilicon or it may contain at least one metal layer. The gate structure 214 of the transistor 200 may be made using so-called "gate first" or "gate last" techniques. That is, the gate structure 214 that is present during the formation of the source/drain regions as described herein may be sacrificial in nature as it may be removed after the final source/drain regions of the device 200 are formed and replaced with a replacement gate structure (not shown), e.g., a high-k gate insulation layer and a gate electrode comprised of at least one metal layer. Thus, the presently disclosed inventions should not be considered as limited to any particular materials of construction for the gate structure 214 nor the manner in which such a gate structure 214 is formed. The first sidewall spacer 216 may be made of a variety of different materials, e.g., silicon nitride, and it may be formed by conformably depositing a layer of spacer material and thereafter performing an anisotropic etching process. The first sidewall spacer 216 is sometimes referred to in the industry as "spacer zero," and it may have a base thickness that falls within the range of about 8-15 nm, depending upon the particular application.

Figure 2B:
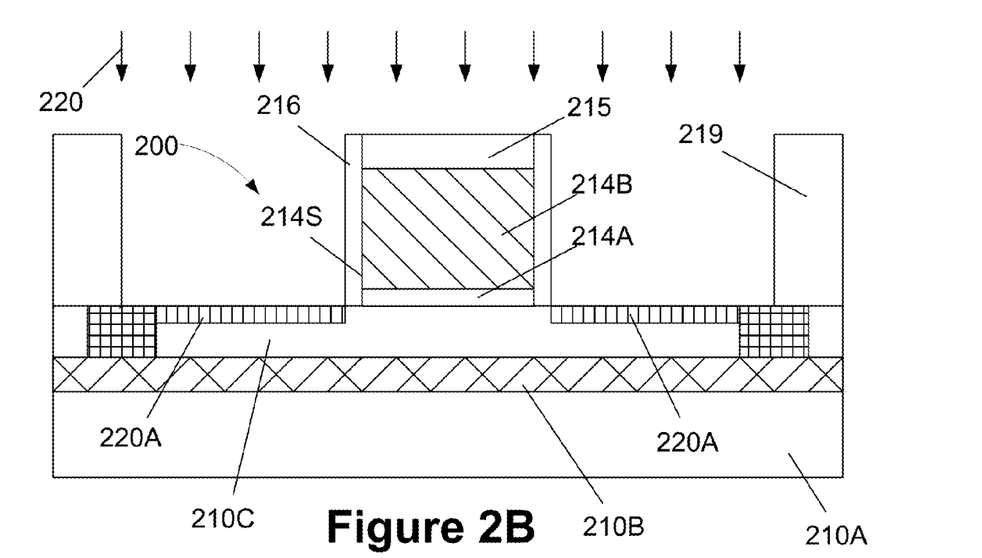

As shown in FIG. 2B, a patterned mask layer 219, e.g., a patterned photoresist mask, is formed above the substrate 210 using known photolithography techniques. Thereafter, an initial extension region ion implantation process 220 is performed to form so-called extension implant regions 220A in the active layer 210C of the substrate 210. In cases where the first sidewall spacer 216 is omitted, the extension implant regions 220A may be self-aligned with respect to the sidewall 214S of the gate structure 214 (e.g., for an NFET transistor in certain applications). However, in the depicted example, the extension implant regions 220A are self-aligned with respect to first sidewall spacer 216. The details of the ion implantation process 220, such as the dopant material implanted, the implant dose and implant energy, may vary depending on the particular application. In one illustrative embodiment, where the device 200 is an NFET transistor, the ion implantation process 220 may be a vertical ion implantation process performed using an N-type dopant, e.g., arsenic or phosphorus, at a dopant dose that ranges from about $1e^{14}$-$5e^{15}$ ions/cm$^2$, at an energy level that ranges from about 1-10 keV.

Figure 2C:
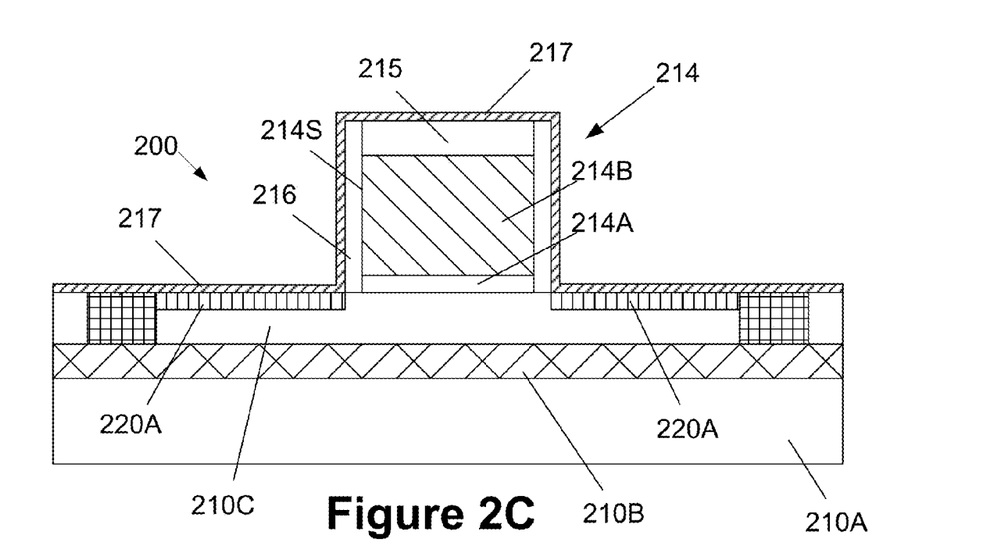

Then, as shown in FIG. 2C, a liner layer 217, e.g., silicon dioxide, is formed on the substrate above the gate structure 214. The liner layer 217 may be formed by conformably depositing a layer of the appropriate material. In one illustrative example, the liner layer 217 may be about 1-2 nm thick.

Figure 2D:
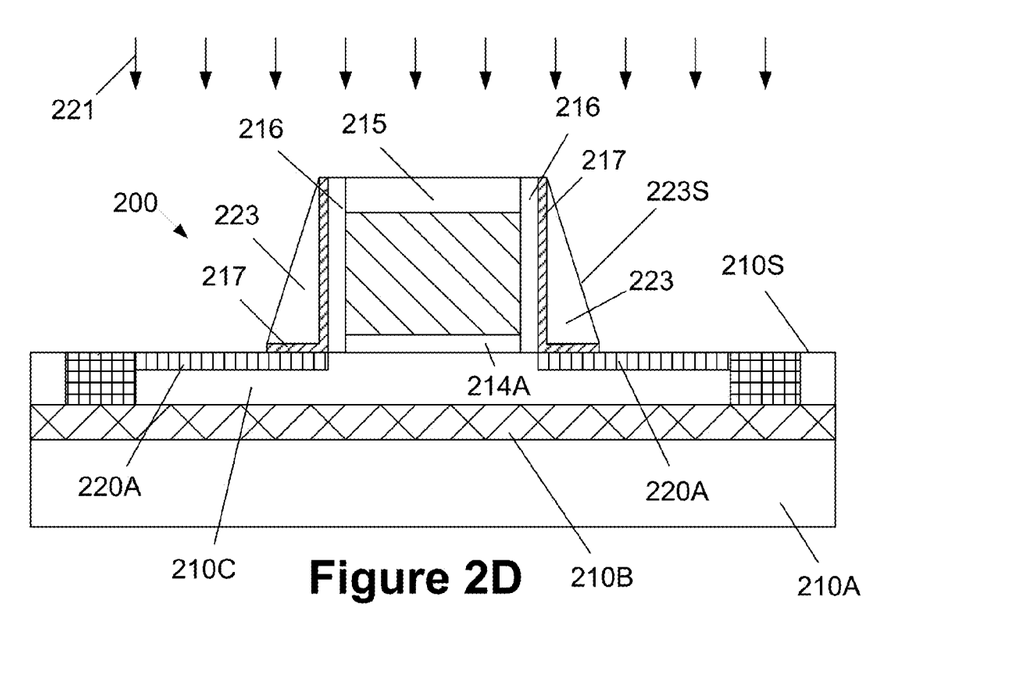

FIG. 2D depicts the device 200 after several process steps were performed to form the novel spacer 223 disclosed herein, which has a generally triangular shaped cross-sectional configuration, on the device 200. Initially, the patterned mask layer 219 (see FIG. 2B) was removed by performing, for example, an ashing process. Thereafter, the sidewall spacer 223 was formed proximate the gate structure 214 by depositing a layer of spacer material and thereafter performing the spacer etch process 221. The sidewall spacer 223 may be comprised of a variety of different materials, e.g., silicon nitride. The base width of the spacer 223 and its overall height may vary depending upon the particular application, e.g., 10-25 nm, 50-90 nm, respectively.

Figure 2E:
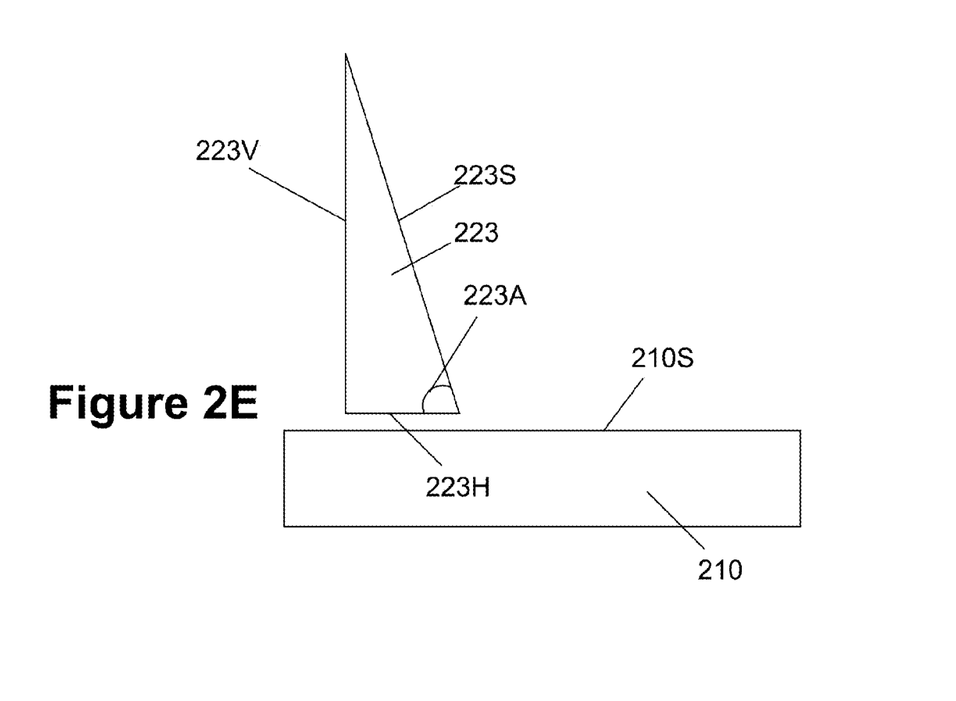

FIG. 2E is an enlarged view of the generally triangular shaped spacer 223. As shown therein, the generally triangular shaped spacer 223 has a first side 223V, a second side 223H and an outer surface 223S. In one illustrative embodiment, the first side 223V may be oriented in a direction that is substantially vertical relative to the upper surface 210S of the substrate 210. In the depicted example, the first side 223V of the generally triangular shaped spacer 223 engages the liner layer 217 along a line that is substantially normal to the upper surface 210S of the substrate 210. In one illustrative embodiment, the second side 223H may be oriented in a direction that is substantially horizontal, although as will be discussed more fully below, the second side 223H may be tilted at an angle relative to the upper surface 210S of the substrate 210 that ranges from about 0-45 degrees. In the depicted example, the second side 223H of the generally triangular shaped spacer 223 engages the liner layer 217 along a line that is substantially parallel to the upper surface 210S of the substrate 210. In one illustrative embodiment, the outer surface 223S of the spacer 223 may be a substantially linear surface that is oriented at an angle 223A relative to the upper surface 210S of the substrate 210. In one illustrative example, the angle 223A may fall within the range of about 45-60 degrees, which is in contrast to the typical sidewall spacer (such as the spacer 16B described in the background section of this application) wherein the corresponding angle is about 80-90 degrees. As used herein and in the appended claims, when it is stated that the novel spacer 223 disclosed herein is formed "proximate" the gate structure 214, such language should be understood to encompass the situation where the novel spacer 223 actually contacts the sidewall 214S of the gate structure 214 (a case where the first spacer 216 and the liner layer are omitted), as well as the depicted situation, where there are intervening structures, i.e., the liner 217 and the first sidewall spacer 216, between the spacer 223 and the gate structure 214. Additionally, the use of geometry type terms to describe various aspects of the configuration of the spacer 223 and the configuration of various doped regions herein, such as "generally triangular-shaped," "substantially linear," should not be understood to imply geometric precision as it relates to the described structure. Rather, such terms should be construed as they would be by those skilled in the art familiar with the shape of various components of manufactured semiconductor devices.

The novel spacer etch process 221 disclosed herein will now be discussed in further detail. In general, the generally triangular shaped spacer 223 may be achieved by modifying the etch chemistry and balancing/controlling anisotropic aspects of the etch process 221 versus isotropic aspects of the spacer etch process 221. In one illustrative example, the spacer etch process 221 is comprised of an anisotropic reactive ion etching (RIE) main-etch process, followed by an isotropic RIE over-etch process, followed by a plasma-strip process, and finally a wet cleaning step. All spacer etch processes require a low etch rate for process control reasons. A minimum step time is needed even for very thin spacer films. To achieve controllable etch times, a low etch rate is achieved in the etch sequence disclosed herein by employing low RF power levels ("top" and "bottom" power sources), as well as very low reactive gas flows. The RIE main etch chemistry is dominated by the inert argon gas flow, which is the main factor to move the process regime towards a more physical sputtering mode, which intrinsically provides a more tapered spacer profile, ideally at an angle of about 45 degrees. Very low additions of reactive gas components, e.g., $CF_4$, and passivating gas components such as, for example, $CH_2F_2$, provide the required control of the etch rate, profile and selectivity to the underlying etch stop layer. Other typical process gases can be used in addition to or as a substitute for the described process gases, such as any $C_xH_yF_z$ gas as a source of hydrogen, which will provide some selectivity. Other inert gases, such as helium, can be used as well. A very low process pressure supports the directionality of the spacer etch. In one particular example, the processing parameters may fall within the following ranges:

gas flows: Ar (50-200 sccm), $CF_4$ (3-20 sccm), $CH_2F_2$ (3-20 sccm) at a very low process pressure between about 3-15 mT; and power levels: about 200-500 W top source (ion generation) and about 300-500V bias voltage (acceleration/directionality).

The main tuning "knobs" for controlling the taper of the spacer are the gas flows, the process pressure and power levels. The main RIE etch step is stopped just before reaching the etch stop layer since its selectivity is not high enough. Thereafter, the process is then switched to the highly selective RIE over-etch step to clear all remaining spacer material with minimal attack on the etch stop layer or the substrate underneath. The novel spacer etch process sequence described above is much different than the prior art spacer etch sequence that is typically performed to form a traditional "D" shaped spacer, such as the spacer 16B depicted in FIGS. 1E-1F. More specifically, as compared to the novel spacer etch sequence disclosed herein, the prior art spacer etch process uses higher gas flow rates, e.g., Ar (30-500 sccm), $CF_4$ (3-50 sccm), $CH_2F_2$ (3-50 sccm), and a higher processing pressure, e.g., about 20-50 mT, etc., to reduce the sputtering component of the prior art etch process which provides a more vertical spacer profile. Also note that, all other things being equal, the novel spacer etching process disclosed herein takes longer to perform than does the prior art spacer etch sequence. While this may increase processing time to a degree, the benefits obtained by generating a spacer with a substantially triangular shaped profile are worth the additional processing time.

Figure 2F:
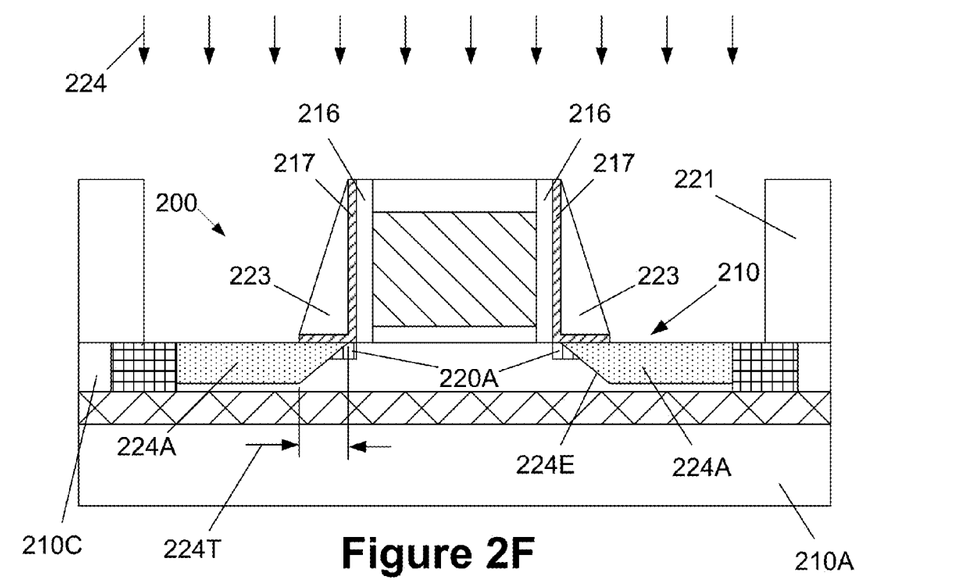

As shown in FIG. 2F, after the generally triangular shaped spacer 223 is formed, a patterned mask layer 221, e.g., a patterned photoresist mask, is formed above the substrate 210 using known photolithography techniques. Thereafter, a so-called source/drain implant process 224 is performed through the patterned mask layer 221 to form the deep source/drain implant regions 224A for the device 200. In one illustrative embodiment, where the device 200 is an NFET transistor, the source/drain implant 224 may be a vertical ion implantation process performed using an N-type dopant, e.g., arsenic or phosphorus, at a dopant dose that ranges from about $1e^{13}$-$3e^{15}$ ions/cm$^2$, at an energy level that ranges from about 5-30 keV. Of course, the type of dopants implanted, either N-type or P-type dopants, depends upon the type of transistor being made, i.e., an NFET transistor or a PFET transistor, respectively.

Given the unique triangular-shaped configuration of the spacer 223, the source/drain implant regions 224A have a transition region 224T where the dopant concentration increases in the area under the spacer 223 as the lateral distance from the sidewall of the gate structure 214 increases. This increase in dopant concentration in the transition region 224T is schematically reflected by the tapered edge 224E of the source/drain implant regions 224A. More specifically, due to its unique shape, the effective masking thickness of the triangular shaped spacer 223 decreases with distance from the gate structure 214. Accordingly, all other things being equal, as the lateral distance from the gate structure 214 increases, more dopant atoms will penetrate the spacer 223 and lodge in the substrate 210.

Figure 2G:
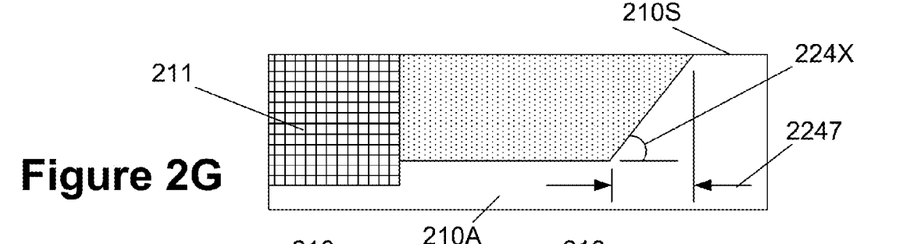

FIG. 2G is an enlarged view of one of the source/drain implant regions 224A. As shown therein, the tapered edge 224E of the source/drain implant regions 224A is oriented at an angle 224X relative to the surface 210S of the substrate 210. The angle 224X of the source/drain implant regions 224A has an impact on the angle 223A of the triangular-shaped spacer 223. More specifically, as the angle 223A decreases (i.e., as the spacer 223 gets wider), the angle 224X generally increases (i.e., the width of the transition region 224T increases), which results in more gradual transition in doping concentration across the transition region 224T. More specifically, by performing the source/drain implant process 224 through the novel triangular-shaped spacer 223 disclosed herein, there is a smoother transition from the extension implant regions 220A (with a relatively lighter dopant concentration) to the main portion of the source/drain implant regions 224A outside of the spacer 223 (with a relatively higher dopant concentration). This smoother transition region 224T of the source/drain implant regions 224A disclosed herein is in stark contrast to the generally abrupt transition between the extension implant regions 20A and the source/drain implant regions 24A of the transistor 100 described in the background section of this application.

Figure 2H:
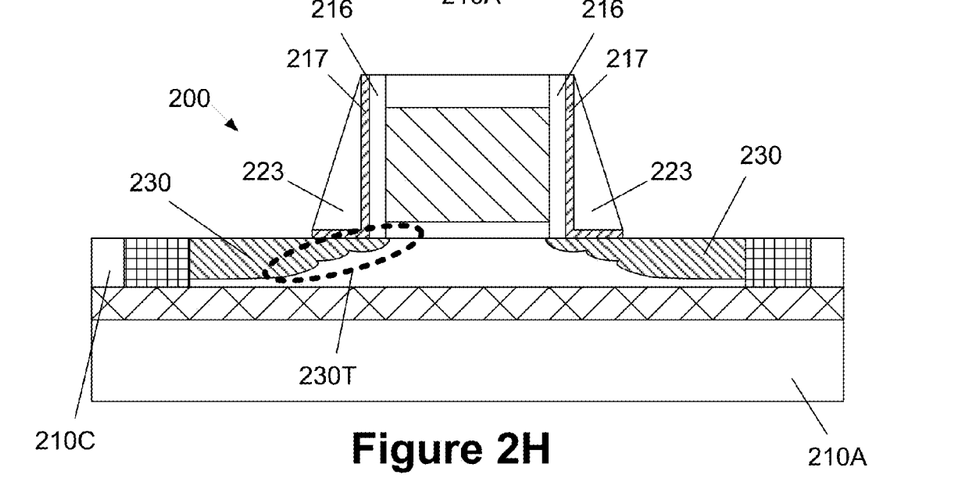

Thereafter, as shown in FIG. 2H, a heating or anneal process is performed to form the final source/drain regions 230 for the transistor 200. In one example, this heating process may be a rapid thermal anneal process that is performed at a temperature of about 1000-1100° C. for a duration of a few seconds, e.g., about 1-3 seconds. This heating process repairs the damage to the lattice structure of the substrate material as a result of the implantation processes and it activates the implanted dopant materials, i.e., the implanted dopant materials are incorporated into the silicon lattice. As a result of performing the source/drain implant process 224 through the novel triangular-shaped spacer 223 disclosed herein, the final source/drain regions 230 tend to exhibit a transition region 230T wherein there is a more gradual transition in dopant concentration as described above. The transition region 230T in the final source/drain regions 230 may tend to solve or at least reduce some of the problems identified in the background section of this application.

Figure 2I:
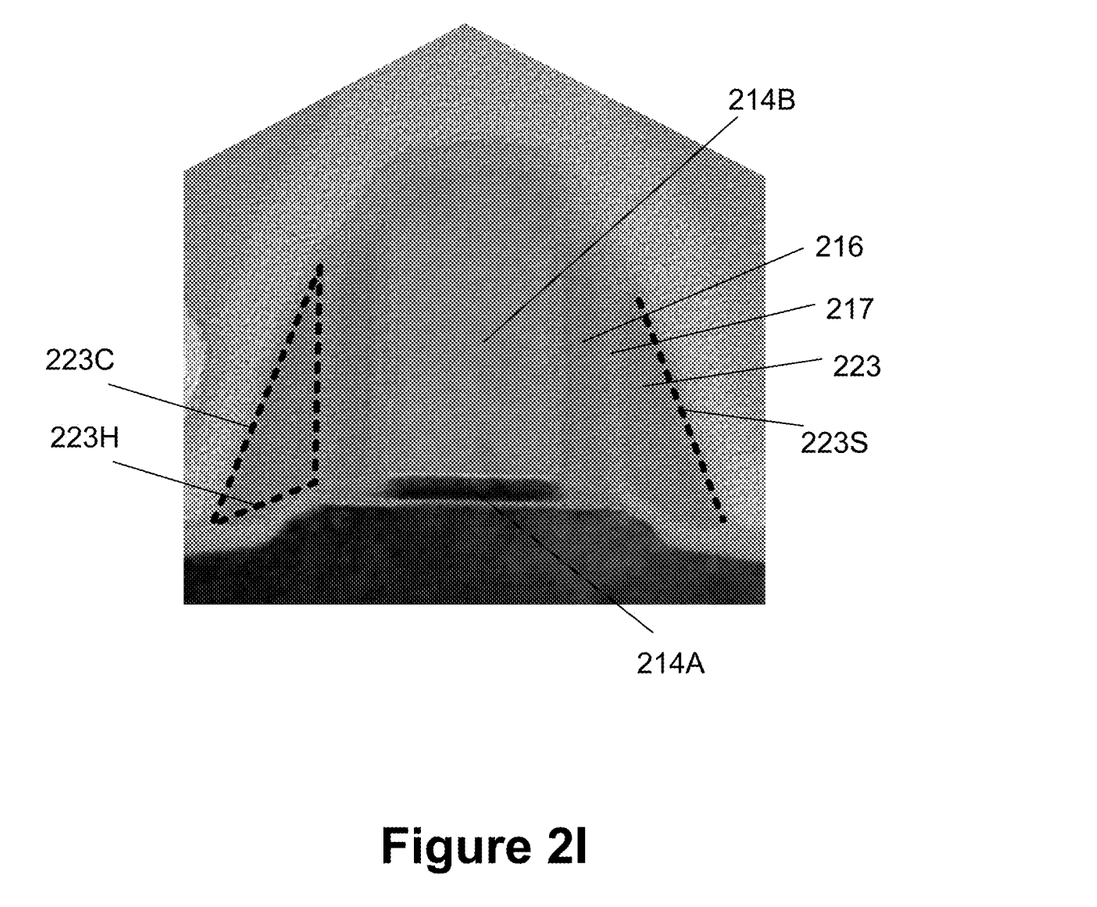

FIG. 2I is an image of a transistor device taken with a scanning electron microscope wherein the novel generally triangular shaped spacer 223 was formed on the device. The various structures in the transistor in FIG. 2I that correspond to the gate insulation layer 214A, the gate electrode 214B, the first sidewall spacer 216, the liner layer 217 and the generally triangular shaped spacer 223 are identified by the same reference number. The general triangular-shaped configuration of the spacer 223 is depicted by the dashed line 223C around the spacer 223 to the left of the gate electrode 214B. The generally linear outer surface 223S of the spacer 223 is depicted on the spacer 223 to the right of the gate electrode 214B. A comparison of FIG. 2I (reflecting the novel spacer 223 disclosed herein) and FIG. 1F (reflecting one embodiment of a prior art spacer 16) demonstrates the sharp distinctions between the configuration of the two spacer structures, i.e., compare the quadrilateral configuration of the prior art spacer 16 (as depicted by the dashed line 25 in FIG. 1F) with the general triangular-shaped cross-sectional configuration of the novel spacer 223 disclosed herein (as reflected by the dashed line 223C). As mentioned above, in this real-world example, the second side of the spacer 223H is oriented at an angle relative to the upper surface of the substrate 210.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a spacer, comprising:
    forming a liner layer;
    forming a layer of spacer material above said liner layer;
    performing a first main reactive ion etching process on said layer of spacer material to remove some of said layer of spacer material;
    stopping said first main reactive ion etching process prior to exposing said liner layer; and
    after stopping said first main reactive ion etching process, performing a second over-etch ion etching process on said layer of spacer material, wherein said first and second ion etching processes are performed using the following parameters:
    an inert gas flow rate within the range of about 50-200 sscm;
    a reactive gas flow rate within the range of about 3-20 sscm;
    a passivating gas flow rate within the range of about 3-20 sscm;
    a processing pressure within about 5-15 mT;
    a power level of about 200-500 W for ion generation; and
    a bias voltage of about 300-500 V.

2. The method of claim 1, wherein said inert gas is one of argon or helium.

3. The method of claim 1, wherein said reactive gas comprises fluorine.

4. The method of claim 1, wherein said passivating gas comprises hydrogen.

5. The method of claim 1, wherein said inert gas is argon, said reactive gas is CF4 and said passivating gas is CH2F2.

6. The method of claim 1, wherein said layer of spacer material is formed above a gate electrode structure for a transistor device.

7. The method of claim 1, wherein said layer of spacer material has a generally triangular cross-sectional configuration.

8. The method of claim 7, wherein said layer of spacer material has a corner defined between a bottom edge of said layer of spacer material adjacent said liner layer and an outer surface of said layer of spacer material, said corner having an angle of between about 45 degrees and 60 degrees.

9. The method of claim 7, wherein said layer of spacer material is formed above a gate electrode structure for a transistor device, said gate electrode structure is disposed above a channel region defined in a substrate, and the method further comprises:
    implanting a dopant into a region of said substrate adjacent said gate electrode structure to define a deep source/drain region, wherein at least a portion of said dopant is implanted through said layer of spacer material to define a doped region having a transition region beneath said layer of spacer material between said channel region and said deep source/drain region.

10. The method of claim 9, wherein said transition region has a dopant concentration that increases with increasing lateral distance from a sidewall of said gate electrode structure upon which said layer of spacer material is formed.

* * * * *